United States Patent [19]

Seshubabu et al.

[11] Patent Number: 5,356,659
[45] Date of Patent: Oct. 18, 1994

[54] METALLIZATION FOR SEMICONDUCTOR DEVICES

[75] Inventors: Desu Seshubabu, Willoughby Hills, Ohio; Hans P. W. Hey; Ashok K. Sinha, both of Allentown, Pa.

[73] Assignee: AT&T Bell Laboratories, Murray Hill, N.J.

[21] Appl. No.: 131,277

[22] Filed: Oct. 4, 1993

Related U.S. Application Data

[63] Continuation of Ser. No. 581,241, Sep. 7, 1990, abandoned, which is a continuation of Ser. No. 892,389, Jul. 31, 1986, abandoned.

[51] Int. Cl.$^5$ .............................................. C23C 16/00
[52] U.S. Cl. ........................................ 427/96; 427/253; 427/255.1; 427/383.5; 437/192; 437/194; 437/213; 437/223; 437/224
[58] Field of Search .................. 427/96, 253, 255.1, 427/383.5; 437/192, 194, 213, 223, 224

[56] References Cited

U.S. PATENT DOCUMENTS

| | | | |
|---|---|---|---|
| 3,585,461 | 6/1971 | Eynon | 437/194 |
| 3,785,862 | 1/1974 | Grill | 427/91 |
| 4,005,452 | 1/1977 | Cook | 437/67 |
| 4,048,649 | 9/1977 | Bohn | 357/23.4 |
| 4,120,706 | 10/1978 | Mason | 357/16 |
| 4,158,613 | 6/1979 | Sogo | 437/194 |
| 4,161,430 | 7/1979 | Sogo | 357/71 |
| 4,263,058 | 4/1981 | Brown | 427/88 |
| 4,271,424 | 6/1981 | Inayoshi | 437/192 |
| 4,310,567 | 1/1982 | Tabata | 427/91 |
| 4,404,235 | 9/1983 | Tarng | 427/91 |
| 4,438,450 | 3/1984 | Sheng | 357/68 |
| 4,517,225 | 5/1985 | Broadbent | 427/90 |
| 4,531,144 | 7/1985 | Holmberg | 357/67 |
| 4,532,702 | 8/1985 | Gigante | 427/91 |
| 4,592,802 | 6/1986 | Deleonibus | 427/88 |
| 4,595,608 | 6/1986 | King | 427/253 |
| 4,617,087 | 10/1986 | Iyer | 427/89 |
| 4,619,840 | 10/1986 | Goldman | 427/91 |
| 4,619,887 | 10/1986 | Hooper | 204/15 |
| 4,629,635 | 12/1986 | Brors | 437/192 |
| 4,742,014 | 5/1988 | Hooper | 437/198 |
| 4,843,453 | 6/1989 | Hooper | 427/305 |

FOREIGN PATENT DOCUMENTS

| | | |
|---|---|---|
| 3194 | 1/1976 | Japan . |
| 17143 | 9/1984 | Japan . |
| 220919 | 12/1984 | Japan ................................. 437/192 |
| 157237 | 8/1985 | Japan ................................. 437/19 X |
| 8801102 | 2/1988 | PCT Int'l Appl. ................. 437/192 |
| 1196834 | 7/1970 | United Kingdom . |
| 1330720 | 9/1973 | United Kingdom . |

OTHER PUBLICATIONS

Shiono Y "Method for Producing a Semiconductor Device" English Translation of Japanese Patent 157237 (Aug. 1985).

Eliot K. Broadbent et al. "Selective Tungsten Processing by Low Pressure CVD" Solid State Technology Dec. 1985, p. 51–59.

H. Exrol, H. S. Lehmen, F. Turene and R. Valletta "Molybdenum Deposition Process" IBM Technical Disclosure Bulletin, vol. 13, No. 5, Oct. 1970 p. 1298.

J. M. Shaw and J. A. Amick "Vapor-Deposited Tungsten as a Metallization and Interconnection Material for Silicon Device" RCA Review vol. 31, No. 2, Jun. 1970 pp. 306–316.

*Primary Examiner*—Shrive Beck
*Assistant Examiner*—Vi Duong Dang
*Attorney, Agent, or Firm*—James H. Fox

[57] ABSTRACT

A low temperature chemical vapor deposition process is used to encapsulate aluminum conductors on the surface of a silicon substrate to form bimetallic conductors. The refractory material is desirably tungsten.

7 Claims, 3 Drawing Sheets

METALLIZATION FOR SEMICONDUCTOR DEVICES

This application is a continuation of application Ser. No. 07/581,241, filed on Sep. 7, 1990, which is a continuation of Ser. No. 06/892,389 filed on Jul. 31, 1986 both abandoned.

TECHNICAL FIELD

This invention relates generally to the field of semiconductor devices and particularly to such devices embodied in integrated circuits. Even more particularly, this invention relates to integrated circuits having encapsulated bimetallic metallizations and to a method for producing the encapsulated bimetallic metallization.

BACKGROUND OF THE INVENTION

Integrated circuits require metallizations to connect the various individual devices within the integrated circuit. As both the complexity and the number of devices in the integrated circuits increase, the dimensions of the lines forming the interconnections, i.e., metallizations, generally decrease as does the spacing between the lines. Although there are often problems associated with the integrity of the lines, these problems become still more severe in very large scale integration (VLSI) due to the very small dimensions of the lines.

Aluminum is frequently the preferred metallization because of its relatively low resistivity and its compatibility with doped silicon. There is the potential for at least four problems to arise from the use of the aluminum. First, aluminum is not a very hard metal and it is possible to scratch the metal before it has been passivated. Second, electromigration of atoms within the lines is possible. Electromigration potentially leads to electrical discontinuities in the line. This problem can be alleviated, and perhaps solved, by depositing the aluminum is a bamboo type structure which stops the electromigration. See U.S. Pat. No. 4,438,450 issued on Mar. 20, 1984. Third, for many applications, it is desirable to deposit the metallization over discontinuities or steps in the physical surface while retaining electrical continuity. This is often difficult to realize with conventional deposition techniques. Fourth, the aluminum lines may develop either or both lateral or vertical hillocks. The development of hillocks is undesirable because it may make further fabrication steps difficult because the lines no longer have their desired geometry.

Several approaches in addition to that already mentioned have been tried in attempts to solve some or all of these problems. For example, films of materials such as Ti, $TiSi_2$, $TaSi_2$, have been deposited over aluminum films in attempts to suppress hillock formation. Additionally, ion implantation with heavier ions such as As, Kr, and Xn has been used for the same purpose. While the approaches are perfectly adequate in eliminating vertical hillock growth, they do not eliminate the problems caused by hillocks growing horizontally from the side of the aluminum metallization. This problem is especially severe with finely spaced Al line. Nor do they necessarily address the other problems discussed.

SUMMARY OF THE INVENTION

We have found that low temperature chemical vapor deposition of a refractory material which covers the exposed surfaces of an aluminum metallization overcomes many problems associated with the prior art aluminum metallizations. The refractory material is electrically conducting. A plurality of aluminum conductors are formed on a surface overlying a silicon substrate, or an overlying dielectric layer, and a refractory material is then selectively deposited, by low temperature chemical vapor deposition, on the exposed surfaces of the conductors. The resulting semiconductor structure thus comprises a silicon substrate, a dielectric layer on said substrate, a plurality of aluminum conductors on the surface and a refractory material which covers the exposed aluminum surfaces to form an encapsulated bimetallic structure. It will be appreciated that the term bimetallic is thus not limited to structures with a first metal layer directly on top of a second metal layer. In a particular embodiment, the refractory material comprises tungsten. Thus, in addition to coating aluminum lines or runners on surfaces, refractory materials deposited by the method of this invention can also be used to coat metals used within windows or plugs i.e., the aluminum conductors need not be on the top surface. Furthermore, use of bimetallic metallizations according to this invention is also contemplated from multilevel interconnections. The use of conductors other than aluminum is also contemplated.

For reasons of clarity, elements of the devices depicted are not drawn to scale.

DETAILED DESCRIPTION

Figure 1:
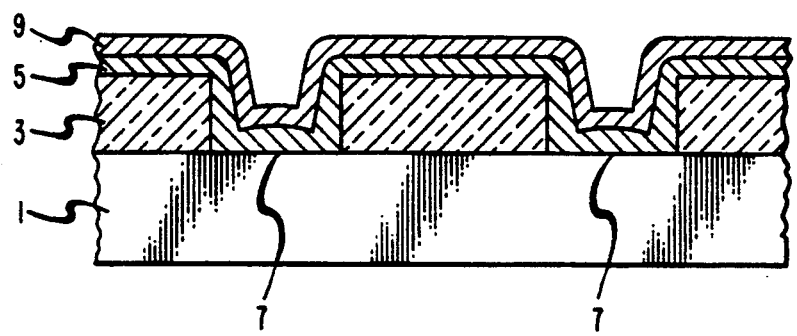
FIG. 1 is a view of one embodiment of a device according to this invention.

FIG. 1 is a schematic view of device according to this invention. It comprises a silicon substrate 1, a dielectric layer 3 and a plurality of aluminum conductors, i.e., metallizations, 5 on the top major surface. There are holes 7 in the dielectric to the silicon substrate. As depicted, the aluminum metallizations are on both the surface of the dielectric, and in the holes 7 which have been coated, but not totally filled, with aluminum. As can be seen, the aluminum conductors have exposed surfaces, i.e., surfaces which dot not contact the silicon substrate or the dielectric material. Deposited on the exposed surfaces of the aluminum are refractory material coatings 9. As can be seen, the refractory material covers the exposed surfaces of the aluminum runners on the dielectric as well as the three exposed surfaces of the aluminum within the holes. It is understood by those skilled in the art that the aluminum is used to electrically contact devices which form the individual components of the integrated circuit but are not shown for reasons of clarity. The structures depicted comprise aluminum features which are covered on their otherwise exposed surfaces by conducting refractory material. These structures are conveniently referred to as encapsulated bimetallic structures and have several advantages as compared to prior art structures. First, as the refractory material surrounds the aluminum features on three sides, there will be no hillocks on either the vertical or the horizontal surfaces of the aluminum. It will be appreciated by those skilled in the art that the refractory overlay prevents stress relief in the aluminum metallization through hillock formation. Second, the hardness of the refractory materials eliminates the possibility of scratching the aluminum and thus impairing the electrical or chemical characteristics of the metallization. Of course, as will be appreciated by those skilled in the art the refractory material is relatively immune to scratches. Third, any electrical problems that might arise due to the electromigration of aluminum are greatly reduced or eliminated because if voids do occur in the aluminum runners, the overlying refractory material has sufficient electrical conductivity so that the desired electrical current can flow through the bimetallic structure. Fourth, due to the nature of the deposition process and the resulting excellent surface coverage, local thinning, such as these present in the window, do not occur.

A similar passivation technique using a dielectric will often cause hillocks to form before there is significant dielectric deposition due to the relatively high deposition temperature. Additionally, there will be no protection against electromigration.

The bimetallic structures are conveniently formed by a low temperature chemical vapor deposition process. It is noted that the selective deposition of the refractory material proceeds, and encapsulates the aluminum on three sides, without a lithographic step. Low temperatures are desirably used as they do not lead to hillock formation. The method will be described by explicit reference to the deposition of tungsten on aluminum. Steps well known to those skilled in the art will not be described. After appropriate processing, a dielectric layer is deposited on the silicon and patterned as desired. An aluminum layer is then deposited and patterned. Tungsten is now deposited. Typical constituents for the chemical vapor deposition of tungsten are hydrogen and $WF_6$. The resulting reaction leads to the deposition of tungsten on the exposed aluminum surfaces. It is believed that the reaction proceeds more expeditiously through a surface activation mechanism with aluminum and within a restricted temperature range proceeds selectively, i.e., only on the exposed aluminum surfaces. Therefore, there is little or no deposition of the refractory material on unwanted surfaces.

It has been found that temperatures within the range from approximately 280 to 350 degrees C. are desirable. Temperatures below 280 degrees C. may be used but the deposition rate becomes undesirably slow. Temperatures above 350 degrees are undesirable because hillocks may begin to form. On 1 $\mu$m thick Al runners, a deposition temperature between 280 and 300 degrees C. was used. The flow rates were 10–120 and 3000 cc/min for $WF_6$ and $H_2$, respectively. The pressure was 0.5 Torr. Deposition times between 15 and 30 minutes resulted in tungsten thicknesses between 500 and 1000 Angstroms. The remainder of the processing sequence is similar to a conventional processing sequence through the contact bake, final is process and passivation steps. Details will be readily known to or easily ascertained by those skilled in the art and thus need not be described in further detail.

The thickness of the tungsten is desirably between 500 and 1000 Angstroms although the precise thickness is not critical. As twice the thickness of tungsten is deposited in the space between lines, thick films may lead to shorting between finely spaced lines. It will also be appreciated that the lines are both wider and closer together than they were before the tungsten was deposited. The narrower spacing was obtained without either etching or lithography.

In addition to the deposition of tungsten, deposition of other materials is contemplated. For example, Mo, Ta or Ti may be deposited on the aluminum surfaces. Use of conductors other than pure aluminum is also contemplated. For example, the presence of other elements, e.g., silicon, in minor amounts is contemplated. Use of Al based alloys is also contemplated. Also, use of other metals, e.g., Mo, is contemplated. Additionally, the bimetallic structure may comprise two layers of the same metal but with different grain structure. For example, sputtered tungsten might be deposited first followed by chemical vapor deposition of tungsten.

Figure 2:
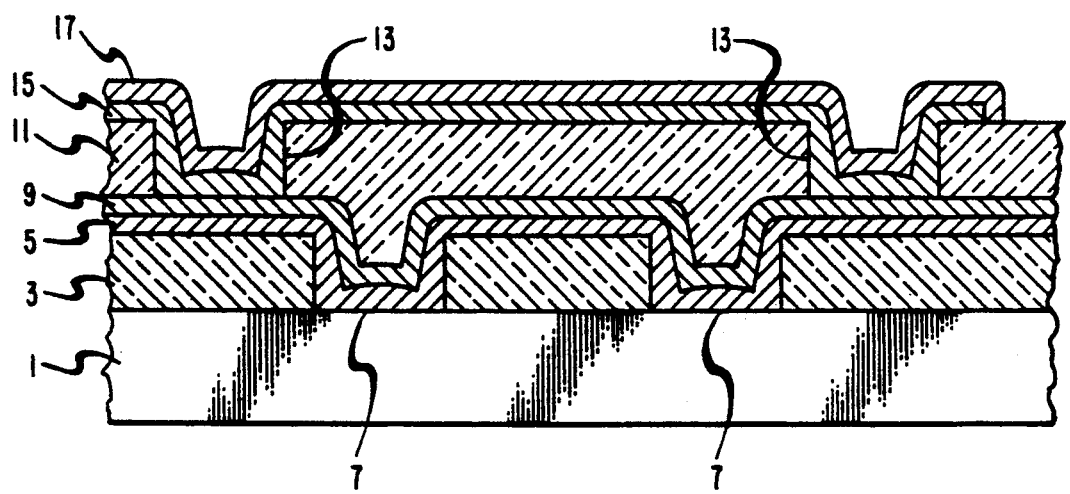
FIG. 2 is a view of another embodiment of a device according to this invention.

Multilevel interconnects are also contemplated. A schematic representation of a multilevel interconnect is depicted in FIG. 2. Numerals identical to those used in FIG. 1 represent identical element. In addition the structure previously depicted, a second dielectric layer 11 is also present and has a plurality of opening 13 which expose a surface of refractory material 9. That is, the second dielectric layer has been patterned. Deposited on refractory material 9 is a layer o aluminum 15 which, in turn, is covered on its exposed surfaces by a layer of refractory material 17. Special attention it drawn to the top right end where covering of the end surface of the aluminum is clearly depicted.

The refractory material is typically the same as that used for the previous layer of refractory material and is deposited by an identical technique. The dielectric materials are typically glass.

Figure 3:
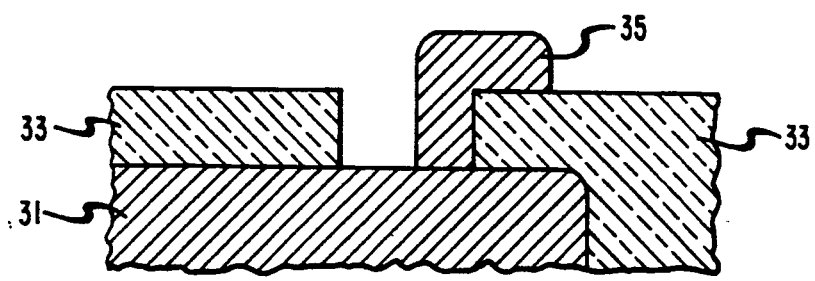
FIG. 3 illustrates an aspect of this invention.
Figure 4:
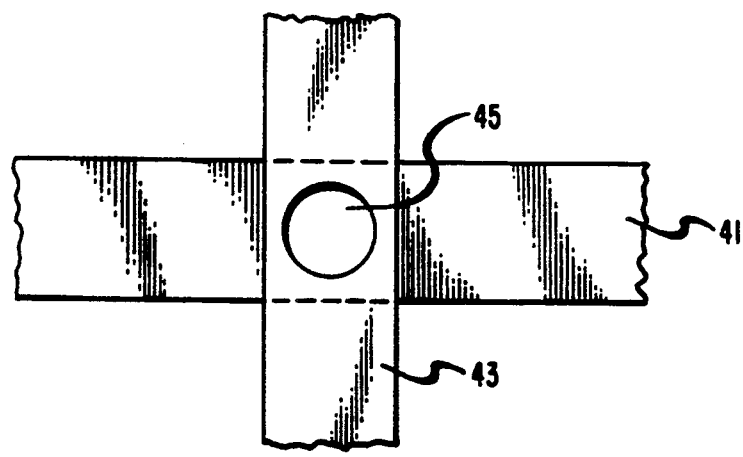
FIG. 4 is a view of another embodiment of this invention.

The etch used to pattern the aluminum etches the aluminum but not the refractory material. There is thus significantly greater tolerances, as correspond to prior art devices, in aligning connecting aluminum lines as there is no danger of the etch removing the first level metallization. FIG. 3 shows a structure having a first level metallization 31, dielectric 33 and second level metallization 35. If, as in prior art structures, both metallizations were aluminum, etching the second metallization would also result in etching the first level metallization. However, the refractory material in the first metallization stops the etch. A top view of a two level interconnection is depicted in FIG. 4. The first level metallization is 41, the second level metallization 43, and they are connected via window 45.

Figure 5:
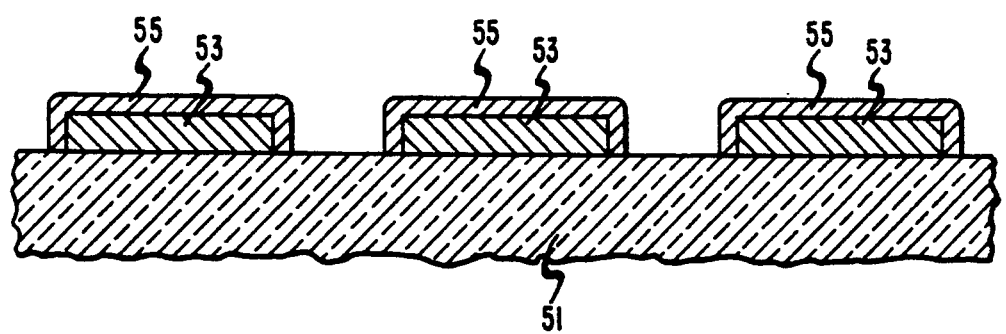
FIG. 5 illustrates an aspect of this invention.

Another view of the encapsulated structure is shows is FIG. 5. There is a dielectric layer 51 and three encapsulated bimetallic structures on layer 51. Each structure comprises a first conductor 53 and a conducting refractory material 55 which covers the exposed surfaces of the conductor to form the encapsulated structure. As can be seen, the tolerances for the overlay of crossing lines are greatly increased.

What is claimed is:

1. A method of making a semiconductor device comprising the steps of: forming a plurality of first aluminum conductors overlying selected portions of a first dielectric layer overlying portion of a semiconductor substrate, said first aluminum conductors having exposed top and side surfaces, characterized by the further step of selectively depositing a metal on said exposed top and side surfaces of said first aluminum conductors to form encapsulated bimetallic structures, wherein said metal has a hardness greater than that of said aluminum conductors;

and comprising the further step of subjecting said encapsulated bimetallic structures to a subsequent processing step that tends to promote the growth of hillocks on said first aluminum conductors, whereby the deposited metal suppresses the growth of said hillocks on said top and side surfaces of said first aluminum conductors.

2. The method of claim 1 wherein said metal is selected from the group consisting of tungsten, molybdenum, tantalum, and titanium.

3. The method of claim 1 wherein said metal is tungsten.

4. The method of claim 3 wherein said tungsten is deposited by selective chemical vapor deposition.

5. The method of claim 4 wherein said chemical vapor deposition uses a mixture of $WF_6$ and $H_2$.

6. The method of claim 1 wherein said subsequent processing step that tends to promote the growth of hillocks is heating to a temperature in excess of 350 degrees C.

7. The method of claim 1 comprising the step of forming a second dielectric layer overlying said first dielectric layer and encapsulated bimetallic structures, with said second dielectric layer having openings exposing some of said bimetallic structures; forming a plurality of second aluminum conductors overlying selected portions of said second dielectric layer; said second aluminum conductors having exposed top and side surfaces, characterized by the further step of selectively depositing a metal on said exposed surfaces of said second aluminum conductors to form encapsulated bimetallic structures, wherein said metal has a hardness greater than that of said second aluminum conductors, whereby the formation of hillocks on the top and side surfaces of said second aluminum conductors is suppressed.

* * * * *